United States Patent
Sano et al.

(10) Patent No.: US 8,116,715 B2
(45) Date of Patent: Feb. 14, 2012

(54) FILTER CIRCUIT AND COMMUNICATION SEMICONDUCTOR DEVICE USING THE SAME

(75) Inventors: Tomohiro Sano, Tokyo (JP); Takaya Maruyama, Tokyo (JP); Hisayasu Sato, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 771 days.

(21) Appl. No.: 12/197,703

(22) Filed: Aug. 25, 2008

(65) Prior Publication Data

US 2009/0068976 A1 Mar. 12, 2009

(30) Foreign Application Priority Data

Sep. 6, 2007 (JP) ................................. 2007-230985

(51) Int. Cl.
*H04B 1/10* (2006.01)
*H04K 3/00* (2006.01)
(52) U.S. Cl. ........................................ 455/307; 327/552
(58) Field of Classification Search .................. 455/307; 327/552–554
See application file for complete search history.

(56) References Cited

U.S. PATENT DOCUMENTS

| 6,084,465 | A * | 7/2000 | Dasgupta | 327/554 |
| 6,556,073 | B2 * | 4/2003 | Morie et al. | 327/554 |
| 2005/0025270 | A1 | 2/2005 | Muhammad et al. | |
| 2006/0006931 | A1 * | 1/2006 | Hsieh et al. | 327/554 |

OTHER PUBLICATIONS

Bagheri, R. eds. "An 800-MHz-6-GHz Software-Defined Wireless Receiver in 90-nm CMOS." Journal of Solid-State Circuits, vol. 41, Issue 12, Dec. 2006.

* cited by examiner

*Primary Examiner* — Lee Nguyen
(74) *Attorney, Agent, or Firm* — McDermott Will & Emery LLP

(57) ABSTRACT

The present invention intends to provide a filter circuit in which an area occupied by the circuit can be reduced by suppressing the scale of its circuit configuration while a predetermined vicinity disturbance wave rejection ratio is maintained and a communication semiconductor device using the same, the filter circuit filtering an analog signal and including a voltage/current conversion circuit for converting the analog signal from voltage to current, and a capacitor array which executes signal processing by charging/discharging the current converted by the voltage/current conversion circuit to/from plural capacitors, the capacitor array being so constructed that the plural capacitors are divided to plural stages so that signals averaged by the capacitor on a preceding stage are accumulated in the capacitor on a next stage successively.

6 Claims, 9 Drawing Sheets

F I G. 1
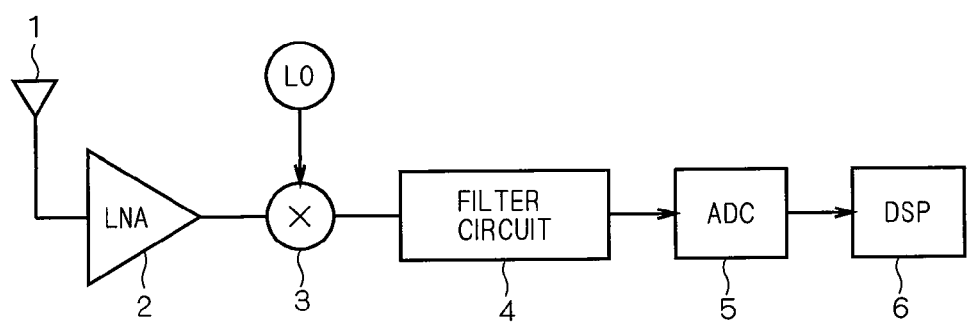
F I G. 2
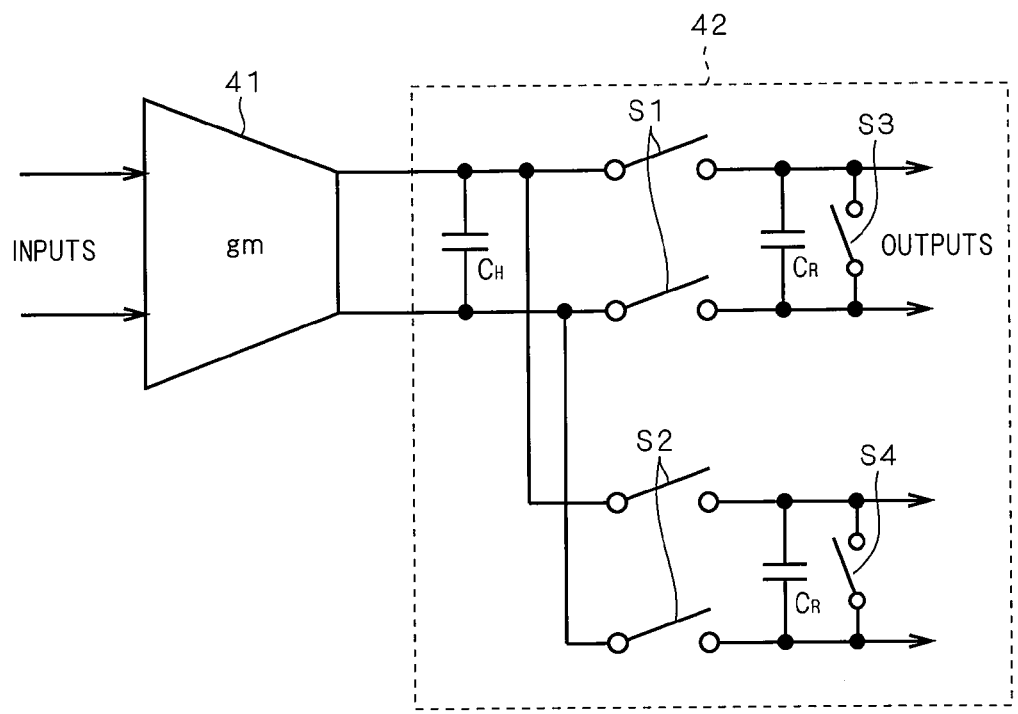

F I G. 1 1
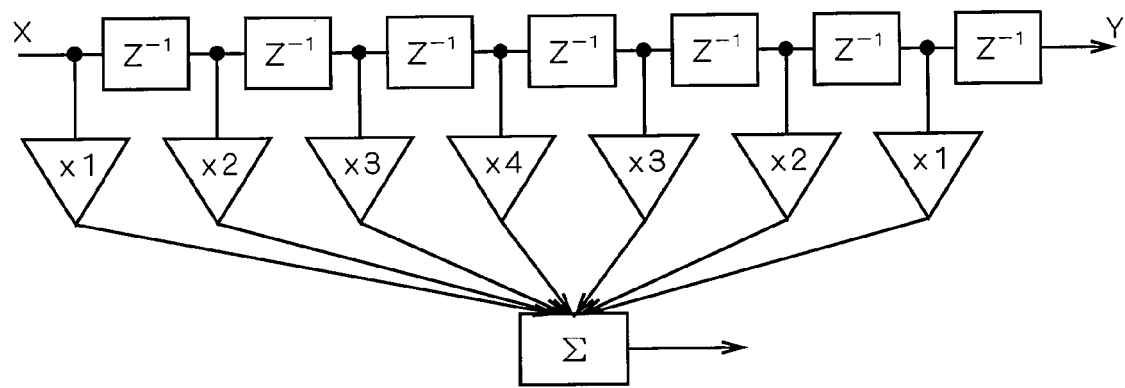
F I G. 1 2
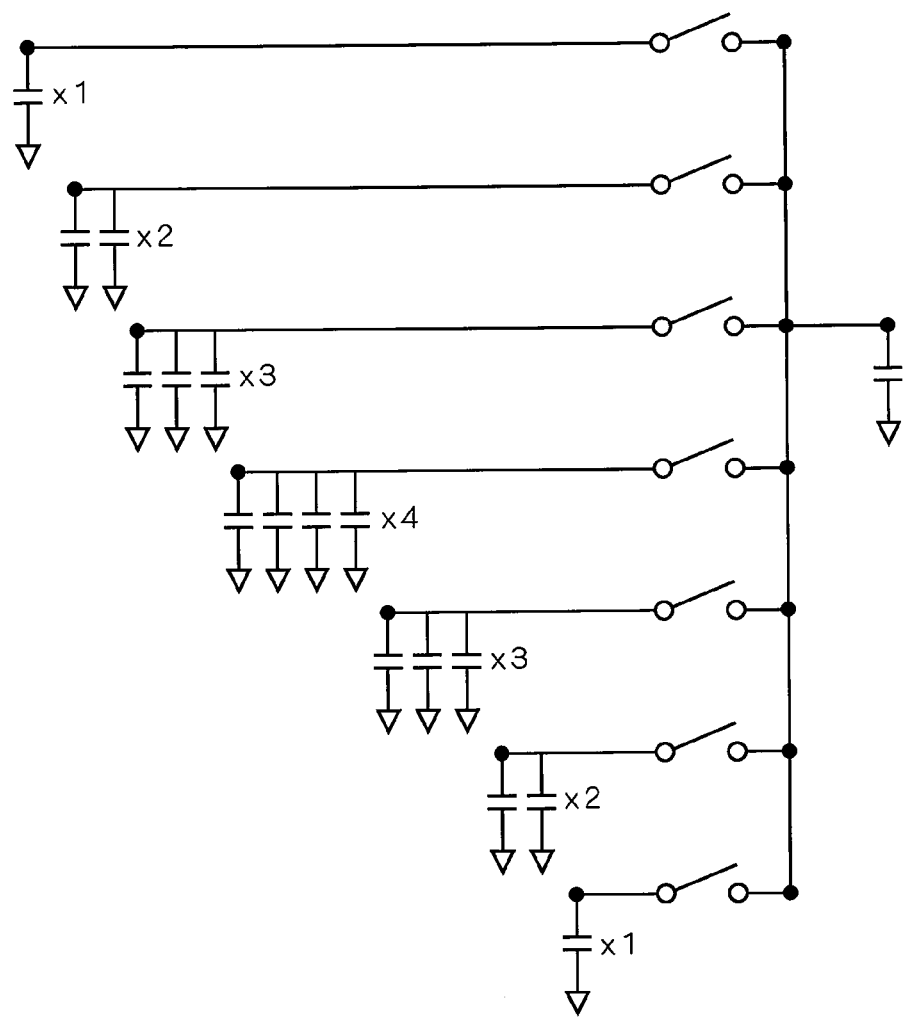

F I G . 1 3
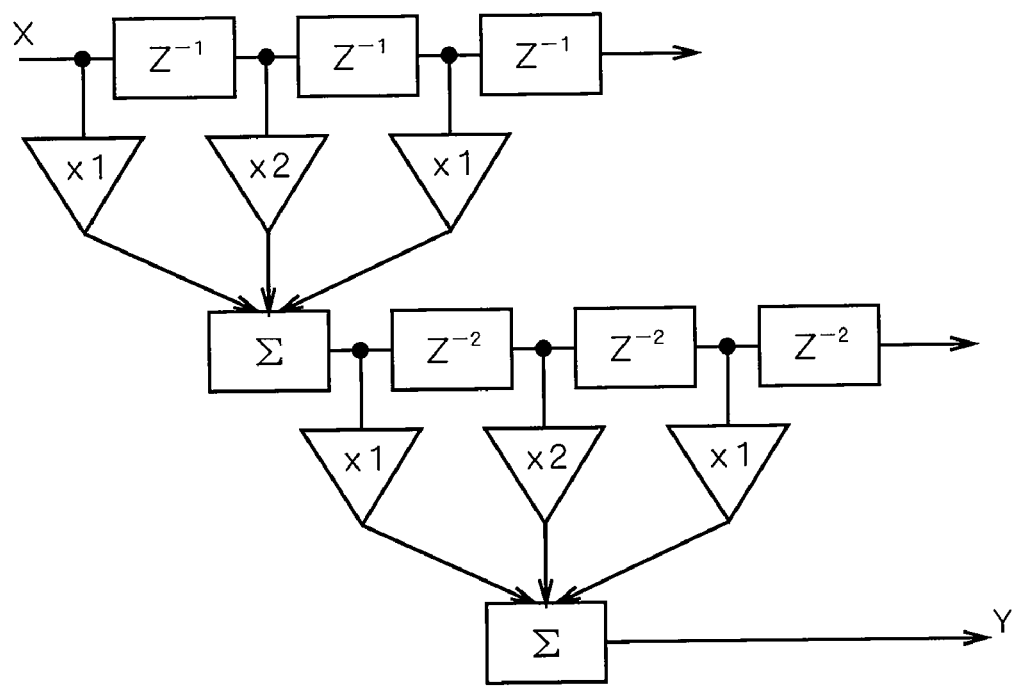
F I G . 1 4
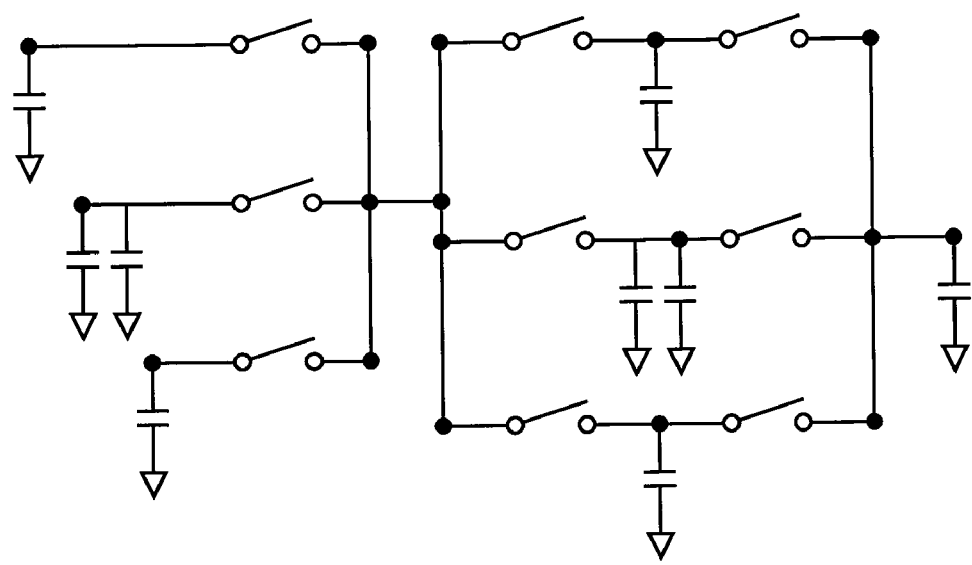

FILTER CIRCUIT AND COMMUNICATION SEMICONDUCTOR DEVICE USING THE SAME

BACKGROUND OF THE INVENTION

1. Field of the Invention

The present invention relates to a filter circuit and communication semiconductor device using the same and more particularly to a filter circuit which allows a signal desired to be received to pass through from incoming analog signals and communication semiconductor device using the same.

2. Description of the Background Art

In recent years, the communication semiconductor device is integrally loaded with various communication systems such as mobile telephone system (for example, PDC, GSM, PHS, W-CDMA), wireless local area network (LAN) (for example, IEEE802.11a, b, g), near-distance wireless communication standard system (for example, Zig-bee, Bluetooth). Then, in the communication semiconductor device, such a multi-mode communication transceiver is an important development theme.

Various communication systems adopted by the communication semiconductor device have each characteristic receiving structure. In a case where an RF signal (signal sent to a communication semiconductor device by being propagated through the air) is converted directly to a base band (BB) signal using an analog-to-digital converter (ADC) and a modulator/demodulator in a receiving portion of the communication semiconductor device, a large power consumption and a tremendous dynamic range are needed.

In the communication semiconductor device, lower power consumption has been progressed using architecture such as a homodyne receiving method (direct conversion), a heterodyne receiving method (low IF conversion) in order to avoid the above-described problem. Each of those methods converts an incoming signal to a lower frequency by means of a frequency conversion circuit (mixer, hereinafter referred to as MIX circuit depending on a case) and then converts to the BB signal by means of the ADC and the modulator/demodulator.

A signal desired to be received (desired wave) and signals not desired to be received (disturbance wave) are mixed in the incoming signal. Thus, the communication semiconductor device needs to be provided with a filter circuit at a stage before the ADC to remove the disturbance waves up to an allowable range in the ADC. This ADC samples analog signals outputted from the filter circuit at a certain cycle Ts and converts to the BB signal (digital signal) having a multi-bit resolution. Thus, the ADC has a sampling frequency (fs=1/Ts) and a resolution corresponding to each system.

When a multi-mode communication transceiver is constructed using the communication semiconductor device, it is necessary to prepare plural circuits corresponding to each method. However, only if a plurality of circuits corresponding to each method is prepared without any measure, the circuit structure is expanded thereby an occupied area being increased. Then, the communication semiconductor device is equipped with a character which can vary the characteristic of the circuit corresponding to each method (variable character) and a configuration capable of controlling that variable character is adopted. Consequently, that configuration can be adopted for the plural communication systems while the circuit structure size is reduced to decrease the occupied area.

Bagheri, R, et al. "An 800-MHz-6-GHz Software-Defined Wireless Receiver in 90-nm CMOS.", Journal of Solid-State Circuits, Volume 41, Issue 12, December 2006 and US patent No. 2005/0025270 have disclosed a switched capacitor filter type configuration in which a filter circuit is provided with a character capable of changing the characteristic of the circuit corresponding to each method so as to control that variable character easily.

In the switched capacitor filter type filter circuit, the ratio occupied by the capacitor area is large. To improve a vicinity disturbance wave rejection ratio which is one of the characteristic of the filter circuit, a TAP number or a decimation ratio needs to be increased or a sampling frequency needs to be lowered.

However, if the TAP number or the decimation ratio is increased in the filter circuit, the area of the capacitor is increased further so that the scale of hardware is increased, which is a problem to be solved. For example, in a case where the TAP number is "4", a filter circuit needs four delay stages each constituted of capacitor and four buffers.

To raise the vicinity disturbance wave rejection ratio of the filter circuit, the TAP number or the decimation ratio needs to be increased, thereby the delay stages and the number of buffers being increased. That is, the configuration of the filter circuit becomes tremendous whereby the occupied area being increased. In the meantime, to change the sampling frequency in the filter circuit, since the frequency in a circuit of a stage after the filter circuit needs to be changed, influence of that change on the entire configuration of the communication semiconductor device is intensified.

SUMMARY OF THE INVENTION

An object of the present invention is to provide a filter circuit in which an area occupied by the circuit can be reduced by suppressing the scale of its circuit configuration while a predetermined vicinity disturbance wave rejection ratio is maintained and a communication semiconductor device using the same.

The filter circuit of an embodiment of the present invention is a filter circuit for filtering an analog signal. The filter circuit includes a voltage/current conversion circuit for converting the analog signal from voltage to current and a capacitor array which executes signal processing by charging or discharging the current converted by the voltage/current conversion circuit to/from plural capacitors. The capacitor array is so constructed that the plural capacitors are divided to plural stages to accumulate signals averaged by the capacitor on a preceding stage in the capacitor on a next stage successively.

Because the capacitor array is so constructed that the capacitors are divided to plural stages to accumulate signals averaged by the capacitor on a preceding stage in the capacitor on a next stage successively, the filter circuit of the embodiment of the present invention has an effect of reducing the occupied area by suppressing the scale of the circuit configuration while the predetermined vicinity disturbance wave rejection ratio is maintained.

The communication semiconductor device of an embodiment of the present invention includes: an amplifier circuit which amplifies an analog signal received by an antenna at a predetermined amplification factor; a frequency conversion circuit which converts the analog signal outputted from the amplifier circuit to a predetermined frequency; a filter circuit which allows a signal desired to be received to pass through, of the analog signals converted in terms of the frequency by the frequency conversion circuit; an AD conversion circuit which converts the signal passing through the filter circuit to digital signal; and an arithmetic operation circuit which executes a predetermined signal processing on the signal converted to the digital signal by the AD conversion circuit. The filer circuit of the communication semiconductor device is a filter circuit for filtering an analog signal, including a voltage/current conversion circuit for converting the analog signal from voltage to current, and a capacitor array which executes a signal processing by charging or discharging the current converted by the voltage/current conversion circuit to/from plural capacitors. The capacitor array of the filter circuit is so constructed that the plural capacitors are divided to plural stages so that signals averaged by the capacitor on a preceding stage are accumulated in the capacitor on a next stage successively.

Because the capacitor array is so constructed that the capacitors are divided to plural stages to accumulate signals averaged by the capacitor on a preceding stage in the capacitor on a next stage successively, the communication semiconductor device of the embodiment of the present invention has an effect of reducing the occupied area by suppressing the scale of the circuit configuration while the predetermined vicinity disturbance wave rejection ratio is maintained.

These and other objects, features, aspects and advantages of the present invention will become apparent from the following detailed description of the present invention when taken in conjunction with the accompanying drawings.

BRIEF DESCRIPTION OF THE DRAWINGS

FIG. 1 shows a block diagram of a communication semiconductor device according to a first embodiment of the present invention;

FIG. 2 shows a circuit diagram of a CT-FIR+DT-IIR system of the first embodiment of the present invention;

FIG. 11 shows a schematic diagram of a system on the premise of the DT-FIR system of a second embodiment of the present invention;

FIG. 12 shows a circuit diagram of the system on the premise of the DT-FIR system of the second embodiment of the present invention;

FIG. 13 shows a schematic diagram of the DT-FIR system of the second embodiment of the present invention; and FIG. 14 shows a circuit diagram of the DT-FIR system of the second embodiment of the present invention.

DESCRIPTION OF THE PREFERRED EMBODIMENTS

First Embodiment

Figure 3:
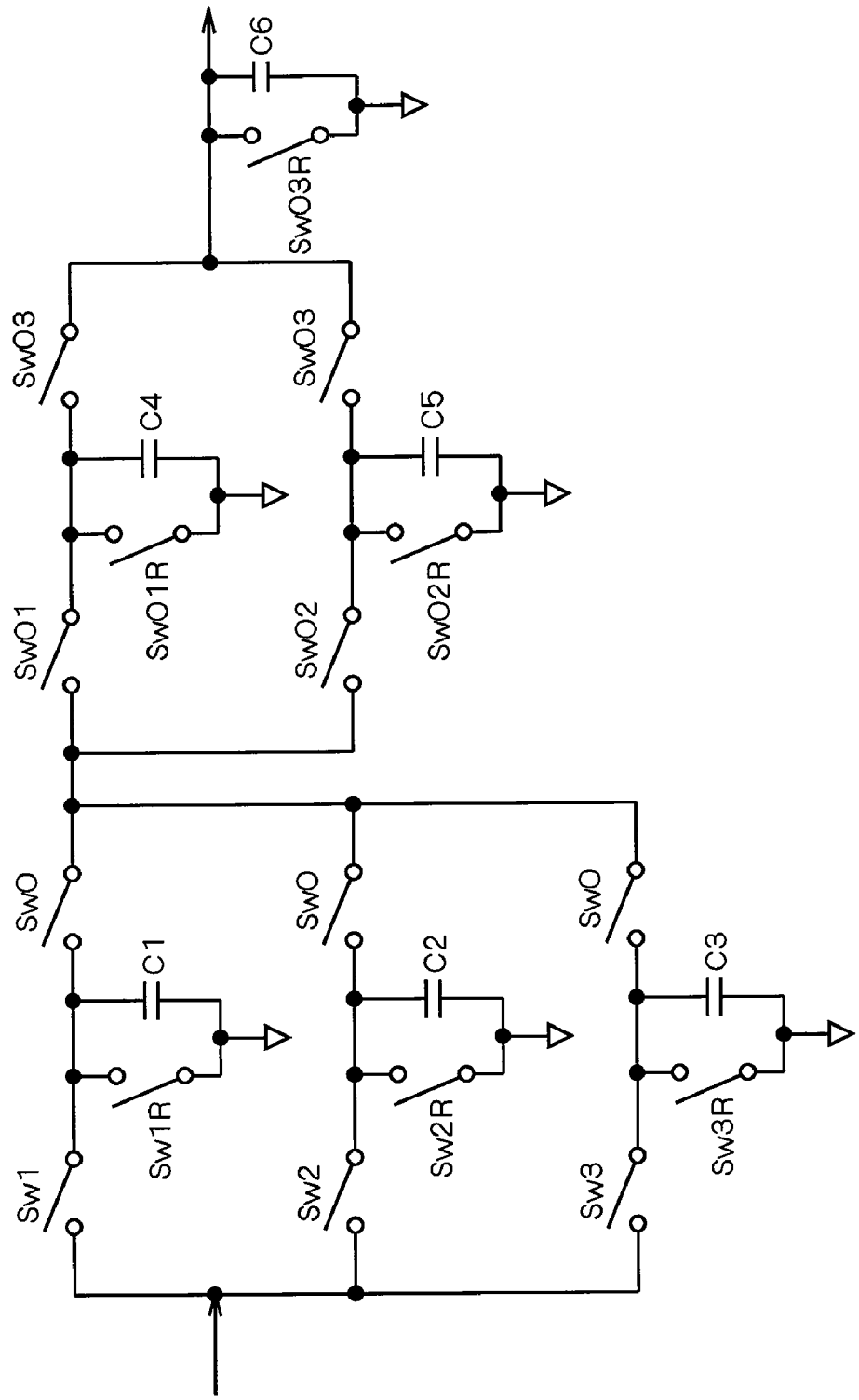
FIG. 3 shows a circuit diagram of a DT-FIR system of the first embodiment of the present invention.

FIG. 1 shows a block diagram of a communication semiconductor device of the present invention. In the communication semiconductor device shown in FIG. 1, a signal sent by being propagated through the air is received by an antenna 1 and that signal is amplified by a low noise amplifier (LNA) 2. The signal amplified by the LNA 2 is converted to a frequency which is easy to process by a circuit on subsequent stages by a MIX circuit 3. For example, a signal having a frequency of 2.4 GHz or 5 GHz is converted to a DC frequency of several to several tens MHz by the MIX circuit 3.

The signal after converted in frequency by the MIX circuit 3 is separated to a signal desired to be received (desired wave) and a signal not desired to be received (disturbance wave) by a filter circuit 4 and the desired wave is propagated to a circuit of a next stage. A signal passing through the filter circuit 4 is converted from an analog signal to a digital signal by an AD converting circuit (ADC) 5. A signal converted by the ADC 5 is subjected to desired digital signal processing by a DSP 6 or the like.

In the communication semiconductor device shown in FIG. 1, characteristic control to allow only a desired wave corresponding to each system in the filter circuit to pass through is required to cope with multi-mode. Thus, the filter circuit 4 of this embodiment adopts the configuration of a switched capacitor filter type, which will be described in detail below.

The filter circuit 4 of this embodiment includes a gm cell (voltage current conversion circuit) which is connected to an input signal terminal so as to convert a signal from voltage to current and a capacitor array which performs signal processing by charging/discharging a current after conversion. If describing this filter circuit 4 as a signal processing system, the filter circuit 4 includes a portion having a gm cell 41 and a capacitor array 42 shown in FIG. 2 and a capacitor array 43 shown in FIG. 3.

The portion having the gm cell 41 and the capacitor array 42 shown in FIG. 2 is a system constituted of continuous time (CT) type finite impulse response (FIR) and discrete time (DT) type infinite impulse response (IIR) (hereinafter referred to as CT-FIR+DT-IIR system). On the other hand, the portion of the capacitor array 43 shown in FIG. 3 is a system constituted of discrete time type FIR (hereinafter referred to as DT-FIR system).

Figure 4:
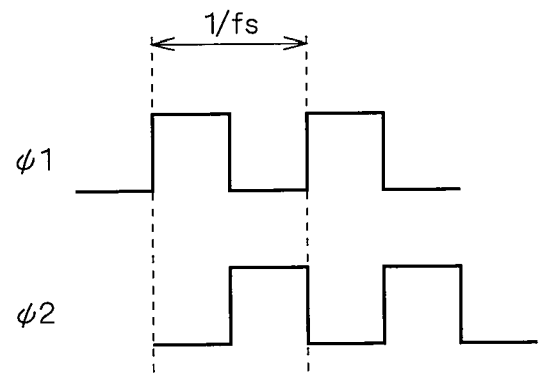
FIG. 4 shows a timing chart for driving the CT-FIR+DT-IIR system of the first embodiment of the present invention.

The CT-FIR+DT-IIR system shown in FIG. 2 includes the gm cell 41 which converts an input signal from voltage to current and a capacitor array 42 which charges/discharges capacitors $C_H$, $C_R$ by controlling switches S1-S4. In this CT-FIR+DT-IIR system, the switches S2, S3 are driven at a timing of a signal ψ1 (frequency 1/fs=Ts) shown in FIG. 4 and the switches S1, S4 are driven at a timing of a signal ψ2 (frequency 1/fs=Ts) shown in FIG. 4. That is, the CT-FIR+DR-IIR system shown in FIG. 2 executes filtering processing with the capacitor $C_H$ connected to the gm cell 41 and the capacitor $C_R$ which is turned ON/OFF by the switches S1-S4.

Next, an operation of the CT-FIR+DT-IIR shown in FIG. 2 will be described. First, an inputted voltage is voltage/current converted by the gm cell 41 on a first stage. Then, the signal ψ2 is turned to "H" so that the switches S2, S3 are turned ON and consequently, charges deposited in capacitors $C_R$ on an upper stage and lower stage are reset. Next, as for a current outputted from the gm cell 41, when the signal ψ1 is turned to "H" so that the switches S2, S3 are turned ON, the capacitor $C_H$ and the capacitor $C_R$ on the lower stage are charged. Then, as for a current outputted from the gm cell 41, when the signal ψ2 is turned to "H" so that the switches S1, S4 are turned ON, the capacitor $C_H$ and the capacitor $C_R$ on the upper stage are charged. At a moment when the signal ψ2 is turned to "H" and the signal ψ1 is turned to "L", charges are divided between the capacitor $C_H$ and the capacitor $C_R$ on the lower stage A transfer function of the CT-FIR+DT-IIR system shown in FIG. 2 is expressed in equation 1.

$$Av(s) = \frac{gm}{C_R \cdot fs} \cdot \text{sinc}\left(\pi \frac{f}{fs}\right) \cdot \frac{1}{1 - a_1 z^{-1}}$$ [Equation 1]

$a_1$ and $z^{-1}$ in equation 1 are given as shown in equation 2.

$$a_1 = \frac{C_H}{C_H + C_R}$$
$$z^{-1} = e^{-sTs}$$ [Equation 2]

As described above, the CT-FIR+DT-IIR system shown in FIG. 2 has a function of filtering an inputted signal in a continuous time period to convert to discrete time signal and output it. Although FIG. 2 shows a structure in which the gm cell 41 is operated by differential, a structure which is operated on one side with the one side grounded may be used.

Figure 5:
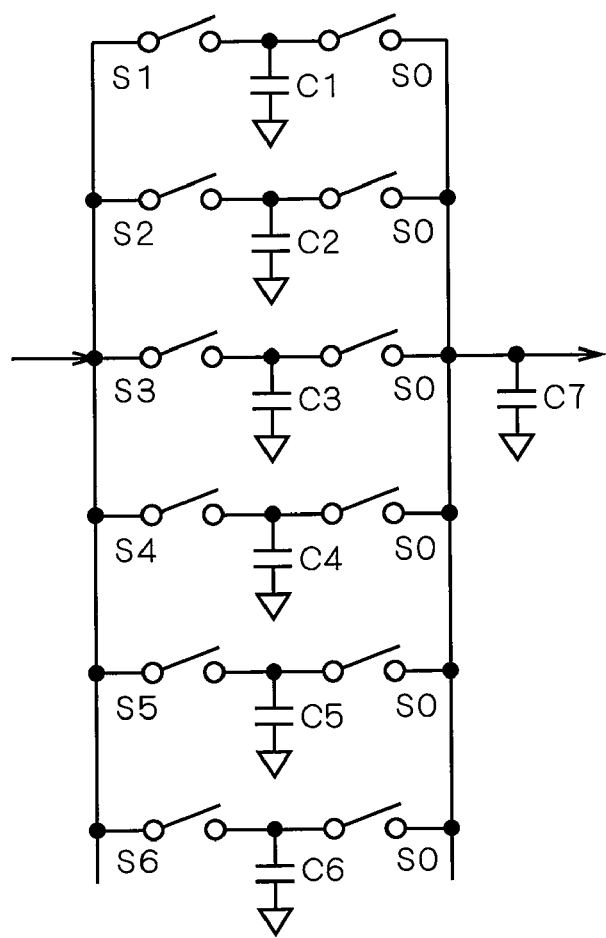
FIG. 5 shows a circuit diagram of a system on the premise of the DT-FIR system of the first embodiment of the present invention.
Figure 6:
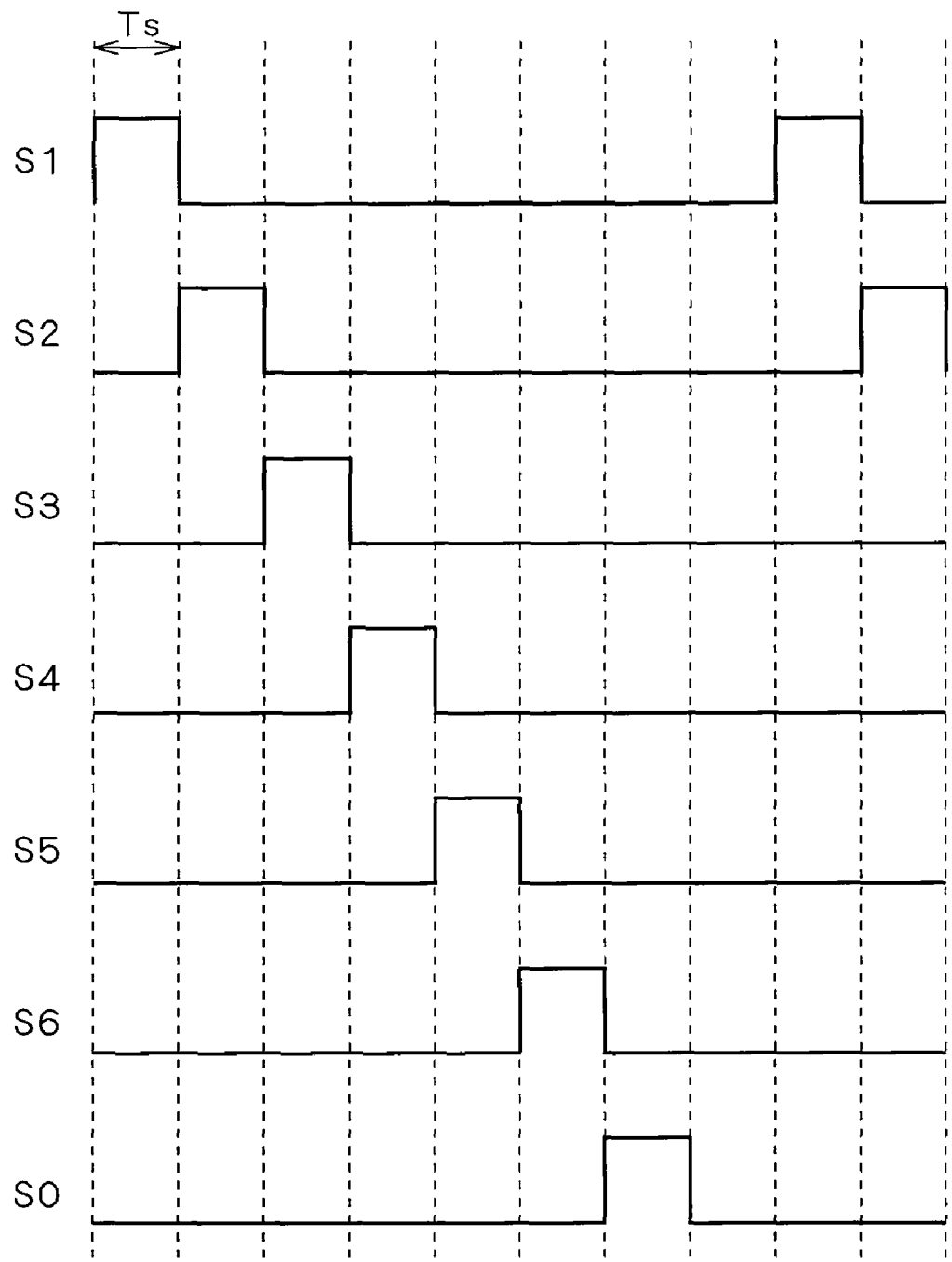
FIG. 6 shows a timing chart for driving a circuit diagram of the system on the premise of the DT-FIR system of the first embodiment of the present invention.

The DT-FIR system shown in FIG. 3 will be described. Prior to this description, the structure of the DT-FIR system which is a premise of the present invention is shown in FIG. 5 and that structure will be described. In the meantime, the timing chart shown in FIG. 6 is a timing chart for driving the DT-FIR system shown in FIG. 5.

In the DT-FIR system shown in FIG. 5, six capacitors C1-C6 are connected to inputs in parallel through the switches S1-S6. Further, in the DT-FIR system shown in FIG. 5, capacitors C1-C6 are provided with a switch S0 and charges accumulated in the capacitors C1-C6 can be averaged by a capacitor C7. In the meantime, a signal inputted to the DT-FIR system shown in FIG. 5 is a discrete time signal which is outputted from the CT-FIR+DT-IIR system shown in FIG. 2.

Next, an operation of the DT-FIR system shown in FIG. 5 will be described based on signals inputted to the switches S1-S6, S0. First, a signal inputted to the switch S1 is turned to "H" so that the switch S1 is turned ON in a period of the frequency Ts. Then, while the switch S1 is in ON state, charges are accumulated in the capacitor C1 based on the discrete time signal inputted to the DT-FIR system. Next, a signal inputted to the switch S2 is turned to "H" so that the switch S2 is turned ON in a period of the frequency Ts and charges are accumulated in the capacitor C2. Hereinafter, the same operation is repeated up to the capacitor C6. Then, a signal inputted to the switch S0 is turned to "H" and all the switches S0 are turned ON in a period of the frequency Ts, and consequently, charges accumulated in the capacitors C1-C6 are averaged by the capacitor C7.

The transfer function of the DT-FIR system shown in FIG. 5 is expressed in equation 3.

$$H(z) = 1 + Z^{-1} + Z^{-2} + Z^{-3} + Z^{-4} + Z^{-5}$$ [Equation 3]

Figure 7:
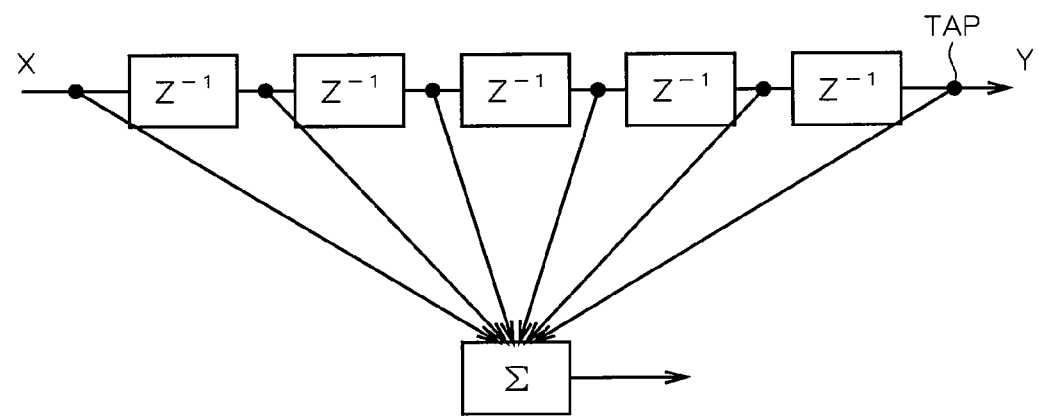
FIG. 7 shows a schematic diagram of the system on the premise of the DT-FIR system of the first embodiment of the present invention.

The DT-FIR system shown in FIG. 5 adopts a structure in which five delay elements ($z^{-1}$) are connected in series as shown in FIG. 7 for the transfer function shown in the equation 3. Because in the structure shown in FIG. 7, the TAP number is 6, capacitors C1-C7 of the TAP number plus 1 are provided on the DT-FIR system shown in FIG. 5.

Figure 8:
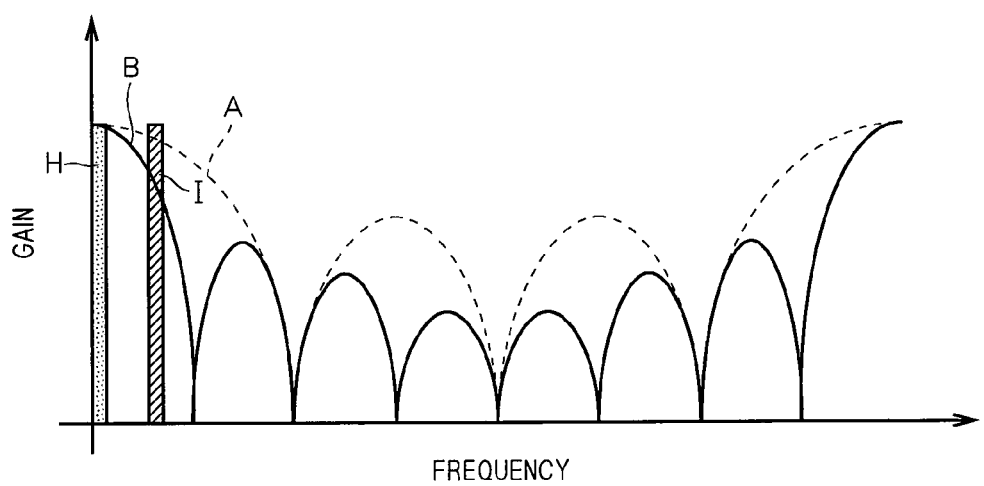
FIG. 8 shows a diagram for explaining the relationship between the TAP number and the vicinity disturbance wave rejection ratio.

To reduce the interfere signal more efficiency, as described above, the TAP number needs to be raised and when this TAP number is raised, the quantity of the capacitors is increased. More specifically, an effect of increasing of the TAP number on the vicinity disturbance wave rejection ratio of the filter circuit will be described. FIG. 8 is a diagram showing the relationship of the transfer function with respect to the desired wave H. FIG. 8 represents a waveform A of the transfer function shown in the equation 4 and a waveform B of the transfer function shown in the equation 5 with respect to the desired wave H. In the meantime, the abscissa axis of FIG. 8 indicates the frequency and the ordinate axis indicates a standardized gain.

$$H(z) = 1 + Z^{-1} + Z^{-2} + Z^{-3}$$ [Equation 4]

$$H(z) = 1 + Z^{-1} + Z^{-2} + Z^{-3} + \ldots Z^{-7}$$ [Equation 5]

Because the TAP number of the equation 4 is 4 and the TAP number of the equation 4 is 8, in the DT-FIR system achieved by the equation 5, the quantity of capacitors is increased thereby the configuration of the circuit being tremendous. However, although as evident from FIG. 8, almost all waves pass the desired wave H regardless of the waveform A or waveform B, the waveform B having a larger TAP number can remove the disturbance wave I. That is, although in the DT-FIR system, the vicinity disturbance wave rejection ratio of the filter circuit can be improved by increasing the TAP number, the quantity of the capacitors is increased thereby the occupied area of the circuit structure being increased. In the meantime, the vicinity disturbance wave rejection ratio can be obtained from an intersection position between the disturbance wave I and waveform A and an intersection position between the disturbance wave I and waveform B.

Figure 9:
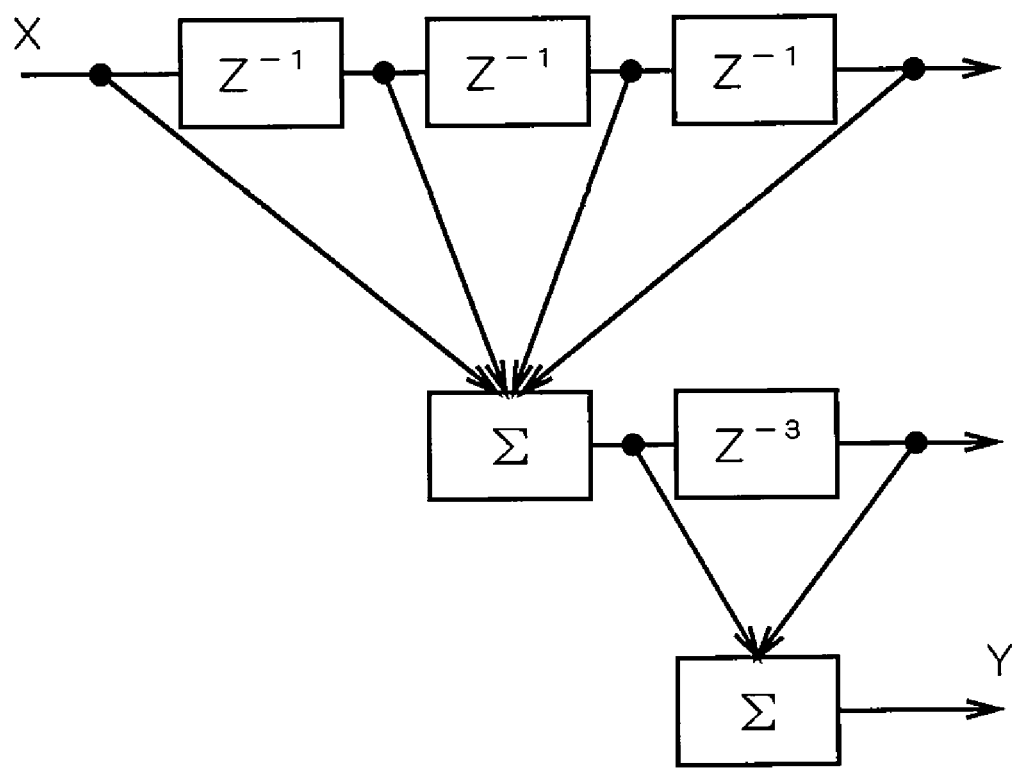
FIG. 9 shows a schematic diagram of the DT-FIR system of the first embodiment of the present invention.

Then, the filter circuit of this embodiment adopts the configuration of the DT-FIR system shown in FIG. 3 which can obtain the same transfer function by reducing the quantity of the capacitors. The transfer function of the DT-FIR system shown in FIG. 3 is expressed by the equation 3 and although it is equal to the DT-FIR system shown in FIG. 5, the delay elements are not connected in series as shown in FIG. 7 but the structure shown in FIG. 9 is adopted. That is, in FIG. 9, the delay elements are separated to plural stages and signals averaged by the delay elements on a preceding stage are processed by the delay elements on a next stage successively. Because in the structure shown in FIG. 9, the quantity of the delay elements is 4 and the TAP number is 5, the quantity of the capacitors can be 6, capacitors C1-C6 as shown in FIG. 3.

Next, the structure of the DT-FIR system shown in FIG. 3 will be described. In the DT-FIR system shown in FIG. 3, the discrete time signal outputted from the CT-FIR+DT-IIR system shown in FIG. 2 is inputted to the capacitors C1-C3 shown in FIG. 2 through the switches Sw1-Sw3. Further, in the DT-FIR system shown in FIG. 3, each of the capacitors C1-C3 is provided with a switch Sw0 so as to average charges accumulated in the capacitors C1-C3 with the capacitor C4 or capacitor C5 on a following stage.

The capacitor C4 on the following stage is connected to the capacitors C1-C3 through the switch Sw01 and when the switch Sw01 is turned ON, charges accumulated in the capacitors C1-C3 are averaged by the capacitor C4. Further, the capacitor C5 on the following stage is connected to the capacitors C1-C3 on the preceding stage through the switch Sw02, when the switch Sw02 is turned ON, charges accumulated in the capacitors C1-C3 are averaged by the capacitor C5.

Further, in the DT-FIR system shown in FIG. 3, each of the capacitors C4, C5 is provided with the switch Sw03 so that charges accumulated in the capacitors C, C5 can be averaged by the capacitor C6 on a subsequent stage. In the DT-FIR system shown in FIG. 3, each of the capacitors C1-C6 is provided with a reset switch. More specifically, the capacitor C1 is provided with a switch Sw1R, the capacitor C2 is provided with a switch Sw2R, the capacitor C3 is provided with a switch Sw03R, the capacitor C4 is provided with a switch Sw01R, the capacitor C5 is provided with a switch Sw02R and the capacitor C6 is provided with a switch Sw03R. Although the DT-FIR system shown in FIG. 3 is so constructed to be driven on one side such that one side of the capacitor is grounded, the present invention is not restricted to this example, but may be constructed by differential drive.

Figure 10:
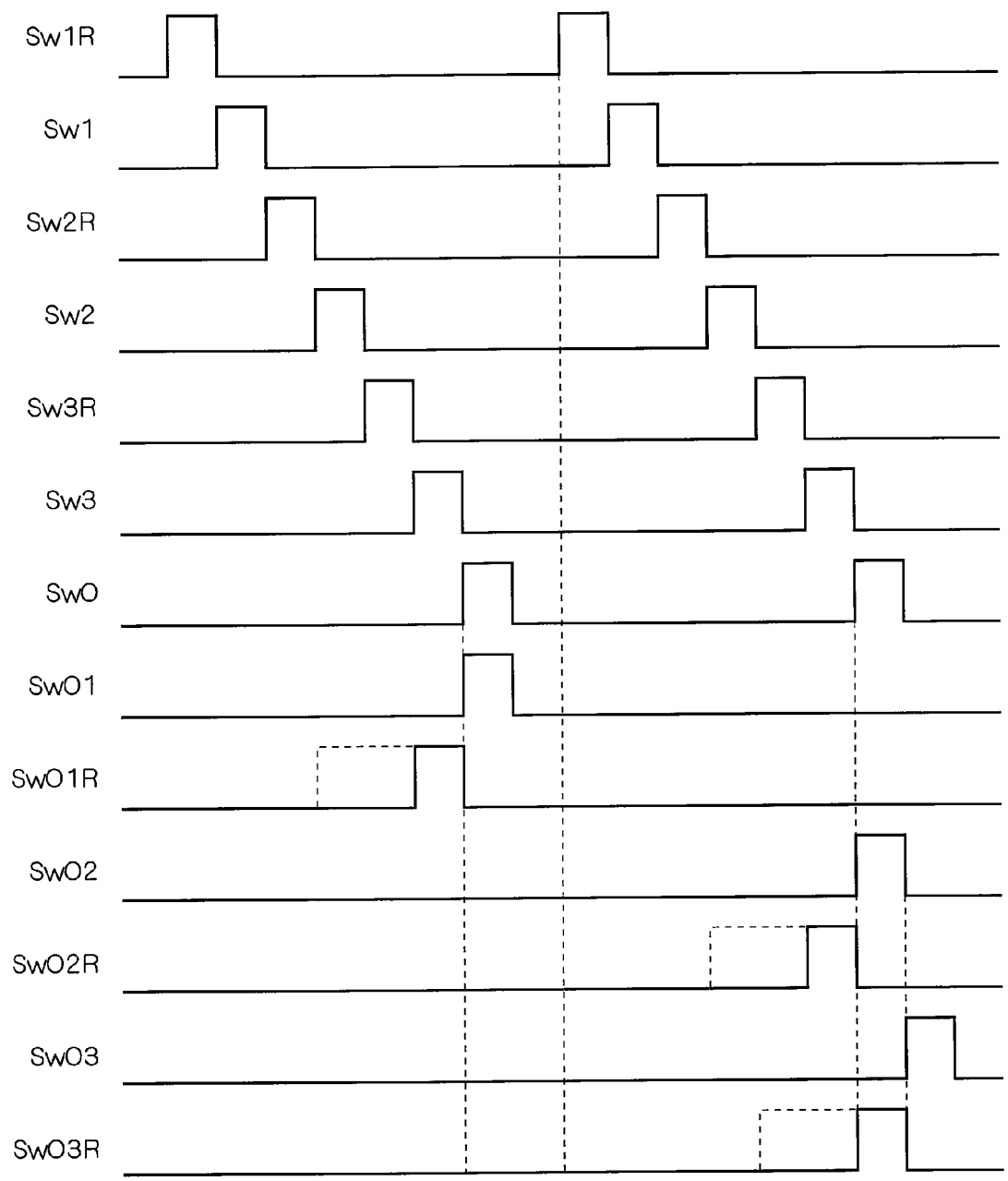
FIG. 10 shows a timing chart for driving the circuit diagram of the DT-FIR system of the first embodiment of the present invention.

Next, an operation of the DT-FIR system shown in FIG. 3 will be described based on a timing chart shown in FIG. 10. The timing chart shown in FIG. 10 represents a signal to be inputted to the switches Sw1-Sw3, switch SW0, switches Sw01-Sw03, switches Sw1R-Sw3R, switches Sw01R-Sw03R.

First, when a signal inputted to the switch Sw1R is turned to "H" and the switch Sw1R is turned ON, the capacitor C1 is reset so that accumulated charges are erased. Then, when a signal inputted to the switch Sw1 is turned to "H" and the switch Sw1 is turned ON, charges are accumulated in the capacitor C1 based on discrete time signal inputted to the DT-FIR system. In the meantime, although in the timing chart shown in FIG. 10, a timing when the switch Sw1R is turned ON is just before a timing when the switch Sw1 is turned ON, the present invention is not restricted to this example, but any timing is permissible as long as it is before a timing when the switch Sw1 is turned ON.

Hereinafter, the same operation is repeated up to the capacitor C3. Then, a signal inputted to the switch Sw0 is turned to "H" and all the switches Sw0 are turned ON. At this timing when all the switches Sw0 are turned ON, the signal inputted to the switch Sw01 is turned to "H" and the switch Sw01 is turned ON. Consequently, charges accumulated in the capacitors C1-C3 are averaged by the capacitor C4. In the meantime, when the signal inputted to the switch Sw01R is turned to "H" so that the switch Sw01R is turned ON, before the switch Sw01 is turned ON, the capacitor C4 is reset so as to erase the accumulated charges. The timing when the switch Sw01R is turned ON may be any time as long as it is before a timing when the switch Sw01 is turned ON.

Although according to the timing chart shown in FIG. 10, the timing when the switch Sw01 is turned ON is the same as the timing when the switch Sw0 is turned ON, the present invention is not restricted to this example but it may be later than the timing when the switch Sw0 is turned ON. If the timing when the switch Sw01 is turned ON and the timing when the switch Sw0 is turned ON are equal, an effect of reducing the entire processing time exists.

Next, the switches Sw1-Sw3 repeat the same operation and then, the signal inputted to the switch Sw0 is turned to "H" and all the switches Sw0 are turned ON. When at the timing when all the switches Sw0 are turned ON, the signal inputted to the switch Sw02 is turned to "H" and the switch Sw02 is turned ON, charges accumulated in the capacitors C1-C3 are averaged by the capacitor C5. In the meantime, before the switch Sw02 is turned ON, the signal inputted to the switch Sw02R is turned to "H" and the switch Sw02R is turned ON and consequently, the capacitor C5 is reset so that accumulated charges are erased. The timing when the switch Sw02R is turned ON may be any time as long as it is before the timing when the switch Sw02 is turned ON.

Although according to the timing chart shown in FIG. 10, the timing when the switch Sw02 is turned ON is equal to the timing when the switch Sw0 is turned ON, the present invention is not restricted to this example, but it may be later than the timing when the switch Sw0 is turned ON. However, if the timing when the switch Sw02 is turned ON and the timing when the switch Sw0 is turned ON are equal, there is an effect of reducing the entire processing time.

Next, the signal inputted to the switch Sw03 is turned to "H", so that all the switches Sw03 are turned ON. When all the switches Sw03 are turned ON, charges accumulated in the capacitors C4, C5 are averaged by the capacitor C6. Before the switch Sw03 is turned ON, the signal inputted to the switch Sw03R is turned to "H" and the switch Sw03R is turned ON, and consequently, the capacitor C6 is reset so that accumulated charges are erased. The timing when the switch Sw03R is turned ON may be any time as long as it is before the timing when the switch Sw03 is turned ON.

As described above, the filter circuit of this embodiment adopts the DT-FIR system shown in FIG. 3 and the capacitors are divided to plural stages and signals averaged on a preceding stage are accumulated in a capacitor on a following stage successively. Consequently, there is an effect that the circuit components can be reduced while the same transfer function is maintained.

Second Embodiment

The transfer function of the DT-FIR system of the first embodiment is linear. However, to raise the vicinity disturbance wave rejection ratio of the filter circuit further, the degree of the transfer function of the DT-FIR system needs to be raised. More specifically, the DT-FIR system of this embodiment adopts a quadratic transfer function in which the TAP number is 4 as indicated in the equation 6.

$$H(z)=(1+Z^{-1}+Z^{-2}+Z^{-3})^2=(1+Z^{-1})^2 \cdot (1+Z^{-2})^2 \quad \text{[Equation 6]}$$

If the transfer function shown in the equation 6 is achieved by a configuration in which the delay elements are arranged in series as shown in FIG. 11, the TAP number is 16 and as shown in FIG. 12, 17 capacitors are required. Thus, if a DT-FIR system of a circuit diagram shown in FIG. 12 is adopted, the circuit configuration becomes tremendous whereby the occupied area being increased.

In the filter circuit of this embodiment, as shown in FIG. 11, the delay elements are not arranged in series but as shown in FIG. 13, the delay elements are divided to plural stages and signals averaged by the delay element on a preceding stage are processed by the delay element on a subsequent stage successively. That is, according to the configuration of FIG. 13, the capacitors are divided to plural stages as shown in FIG. 14 so that signals averaged by a preceding capacitor can be accumulated in a capacitor of a subsequent stage successively. The circuit configuration shown in FIG. 14 of the transfer function is expressed by an equation of a latter stage of the equation 6. Thus, although the DT-FIR system adopting the circuit shown in FIG. 14 has the same transfer function as FIG. 12, the TAP number is 8 and the quantity of required capacitors can be suppressed to 9.

Although the circuit shown in FIG. 14 is so constructed to be driven on one side with one side of the capacitor connected to the ground, the present invention is not restricted to this example but it may be constructed to be driven by differential. Further, the filter circuit adopting the circuit shown in FIG. 14 is applicable to the communication semiconductor device shown in FIG. 1.

As described above, because the filter circuit of this embodiment adopts the DT-FIR system shown in FIG. 14 such that the capacitors are divided to plural stages and signals averaged on a preceding capacitor are accumulated in a capacitor on a subsequent stage successively, the circuit components can be reduced while the same transfer function is maintained.

While the invention has been shown and described in detail, the foregoing description is in all aspects illustrative and not restrictive. It is therefore understood that numerous modifications and variations can be devised without departing from the scope of the invention.

What is claimed is:

1. A filter circuit for filtering an analog signal, comprising:
   a voltage/current conversion circuit for converting said analog signal from voltage to current; and
   a capacitor array which executes signal processing by charging or discharging said current converted by said voltage/current conversion circuit to/from plural capacitors,
   wherein said capacitor array is so constructed that said plural capacitors are divided to plural stages to accumulate signals averaged by a capacitor on a preceding stage in a capacitor on a next stage successively.

2. The filter circuit according to claim 1, wherein said capacitor array comprises: a first switching element for controlling the charge or discharge of each of said capacitors; a second switching element for resetting each of said capacitors; and a third switching element for averaging each of said capacitors on each stage.

3. The filter circuit according to claim 2, wherein said capacitor array is so constructed that at a timing when said third switching element on a preceding stage is opened, said first switching element of said capacitor on a next stage is opened and before the timing, said second switching element of said capacitor on the next stage resets said capacitor on the next stage.

4. A communication semiconductor device, comprising:
   an amplifier circuit which amplifies an analog signal received by an antenna at a predetermined amplification factor;
   a frequency conversion circuit which converts said analog signal outputted from said amplifier circuit to a predetermined frequency;
   a filter circuit which allows a signal desired to be received to pass through, of said analog signals converted in terms of the frequency by said frequency conversion circuit;
   an AD conversion circuit which converts the signal passing through said filter circuit to digital signal; and
   an arithmetic operation circuit which executes a predetermined signal processing on the signal converted to the digital signal by the AD conversion circuit, wherein
   said filer circuit is a filter circuit for filtering said analog signal, including a voltage/current conversion circuit for converting said analog signal from voltage to current, and
   a capacity array which executes a signal processing by charging or discharging said current converted by said voltage/current conversion circuit to/from plural capacitors,
   said capacitor array being so constructed that said plural capacitors are divided to plural stages so that signals averaged by a capacitor on a preceding stage are accumulated in a capacitor on a next stage successively.

5. The communication semiconductor device according to claim 4, wherein said capacitor array comprises: a first switching element for controlling the charge or discharge of each of said capacitors; a second switching element for resetting each of said capacitors; and a third switching element for averaging each of said capacitors on each stage.

6. The communication semiconductor device according to claim 5, wherein said capacitor array is so constructed that at a timing when said third switching element on a preceding stage is opened, said first switching element of said capacitor on a next stage is opened and before the timing, said second switching element of said capacitor on the next stage resets said capacitor on the next stage.

* * * * *